(12) United States Patent
Erdogan et al.

(10) Patent No.: US 6,447,959 B1
(45) Date of Patent: Sep. 10, 2002

(54) AMPLITUDE MASK FOR WRITING LONG-PERIOD GRATINGS

(75) Inventors: Turan Erdogan, Spencerport; Alan D. Heaney; David B. Stegall, both of Rochester, all of NY (US)

(73) Assignee: University of Rochester, Rochester, NY (US)

( * ) Notice: Subject to any disclaimer, the term of this patent is extended or adjusted under 35 U.S.C. 154(b) by 0 days.

(21) Appl. No.: 09/572,520

(22) Filed: May 17, 2000

(51) Int. Cl.[7] .............................. G03F 9/00; G02B 6/34
(52) U.S. Cl. .............................. 430/5; 385/37; 385/123
(58) Field of Search .............................. 430/5; 385/10, 385/28, 37, 123, 124, 125, 126, 127, 128; 359/124, 566, 341.1

(56) References Cited

U.S. PATENT DOCUMENTS 5,768,454 A * 6/1998 Chesnoy et al. ............... 385/37
6,201,911 B1 * 3/2001 Jang ............................ 385/37

OTHER PUBLICATIONS

A.M. Vengsarkar, P.J. Lemaire, J.B. Judkins, V. Bhatia, T. Erdogan, and J. Snipe, "Long–period fiber gratings as band–rejection filters", J. Lightwave Tech., vol. 14, pp. 58–65, 1996.

H.J. Patrick, C.G. Askins, R.W. McElhanon, and E.J. Friebele, "Amplitude mask patterned on an excimer laser mirror for high intensity writing of long period fibre gratings", Electron. Lett., vol. 33, pp. 1167–1168, 1997.

D.Z. Anderson, V. Mizrahi, and T. Erdogan, "Production of in–fibre gratings using a diffractive optical element", Electron. Lett., vol. 29, pp. 566–568, 1993.

K.O. Hill, B. Malo, F. Bilodeau, D.C. Johnson, and J. Albert, "Bragg gratings fabricated in monomode photosensitive optical fiber by UV exposure through a phase mask", Appl. Phys. Lett., vol. 62, pp. 1035–1037, 1993.

T. Erdogan, D. Stegall, A. Heaney, and N. Litchinitser, "Direct single–mode fiber to free space coupling assisted by a cladding mode", Paper FK4, Opt. Fiber Comm. Conf., San Diego, CA, Feb. 21–26, 1999.

* cited by examiner

Primary Examiner—S. Rosasco
(74) Attorney, Agent, or Firm—Eugene Stephens & Associates; Thomas B. Ryan

(57) ABSTRACT

Long-period gratings are written more quickly and at higher intensities by amplitude masks having shadow-forming patterns that scatter, redirect, or otherwise divert shadow portions of radiation used for writing the gratings instead of blocking the shadow portions by absorption or reflection. The shadow-forming masks can be formed along transparent base optics by arrays of diffusers, diffractors, or refractors that relatively divert different portions of the radiation.

27 Claims, 7 Drawing Sheets

AMPLITUDE MASK FOR WRITING LONG-PERIOD GRATINGS

TECHNICAL FIELD

Long-period gratings can be written into photosensitive media of optical waveguides using amplitude masks that contain an array of windows for illuminating periodically spaced sections of the photosensitive media. The illuminated sections undergo a change in refractive index that supports coupling of selected wavelength bands between different propagating modes of the waveguides.

BACKGROUND

The periodic index variations of long-period gratings required to support forward propagating mode shifts along the lengths of optical waveguides have periods generally in the hundreds of microns (but can range from around 10 microns to 1000 microns). The period "$\Lambda$" can be related to a difference between a propagating constant "$\beta_{o1}$" of the fundamental mode and a propagating constant "$\beta_{cl}^{(n)}$" of the "$n^{th}$" cladding mode as follows:

$$\beta_{o1} - \beta_{cl}^{(n)} = \frac{2\pi}{\Lambda}$$

Since the periods "$\Lambda$" are generally well beyond the wavelengths of the radiation used to write long period gratings, which is typically in the ultraviolet range, simple shadowing techniques can be used to produce the periodic intensity patterns required to write long-period gratings in photosensitive media. Typically, the photosensitive medium is irradiated by a field of actinic radiation (e.g., intense ultraviolet radiation) that is interrupted by an amplitude mask so that alternating portions of the field are either transmitted to the photosensitive medium or blocked from reaching the photosensitive medium.

Amplitude masks are commonly formed by metal or dielectric coatings laid down in patterns on transparent glass substrates. The coatings block unwanted light from reaching the photosensitive medium. Uncoated portions of the glass substrate framed by the coatings provide "windows" through which the desired intensity patterns reach the photosensitive medium. Some of the coatings block the unwanted radiation primarily by absorption and others of the coatings block the unwanted radiation primarily by reflection, although both processes occur to some extent in all coatings.

Either type of coating can be degraded by exposure to intense radiation. The absorptive coatings (typically a metal) are subject to ablation, melting, or heating sufficient to promote pealing from the glass. The reflective coatings (typically a dielectric) are expensive, difficult to manufacture, and can still be destroyed by intense radiation. Consequently, intensities are kept low, requiring unnecessarily long exposure times to achieve the desired refractive index change in the photosensitive medium.

SUMMARY OF INVENTION

The invention overcomes the durability problems of prior amplitude masks used for making long-period gratings by scattering, redirecting, or otherwise diverting alternating portions of the illuminating radiation instead of blocking unwanted radiation portions by absorption or reflection. The new amplitude mask transmits both the radiation intended to reach periodic segments of a photosensitive media and the radiation intended not to reach adjacent segments of the photosensitive media. Optical paths taken by the two transmissions are relatively modified, however, to produce the required pattern of illumination while reducing transformations of light energy into heat, thereby allowing long-period gratings to be written more quickly and at higher intensities.

One example of the new amplitude mask includes a base optic made of a material capable of transmitting actinic radiation for writing long-period gratings in a photosensitive medium of optical waveguides. A shadow-forming pattern along the base optic provides for illuminating periodically distributed segments of the photosensitive medium with the actinic radiation transmitted through the base optic. First transmissive portions of the shadow-forming pattern convey first portions of the actinic radiation to the periodically distributed segments of the photosensitive medium, and second transmissive portions relatively divert second portions of the actinic radiation away from adjacent segments of the photosensitive medium.

The second transmissive portions can include (a) diffusers for scattering the second portions of the actinic radiation, (b) diffractors for diffracting the second portions of the actinic radiation, or (c) refractors for relatively bending the second portions of the actinic radiation away from adjacent segments of the photosensitive media. The diffusers generally diminish the concentrations of radiation reaching the adjacent segments of the photosensitive medium. The diffractors and refractors can also reduce the amount of radiation reaching the adjacent segments of the photosensitive medium by spreading the radiation or by redirecting the radiation to other intended locations. For example, the diffractors can be arranged with rulings oriented parallel to a optical axes of the waveguides for diffracting the second portions of the actinic radiation in a direction transverse to the waveguide axes. The refractors, which can include lenses or prisms, can also be arranged to bend light in the direction transverse to the waveguide axes.

The diffusers, diffractors, and refractors can be formed by etching, machining, or otherwise removing material from the base optic as well as by depositing, appending, or otherwise adding material or structure to the base optic. Shadow-forming patterns involving any or all of these transmissive diverting mechanisms can be formed on one or more surfaces of the base optic to produce singular or compound effects of diffusion, diffraction, or refraction.

For example, the base optic can be a glass plate with front and back surfaces through which both portions of the actinic radiation are transmitted, and either or both surfaces can be used to support a shadow-forming pattern. The base optic can also take the form of a prism having an entry surface through which both portions of the actinic radiation pass for entering the prism and one or more exit surfaces through which the two portions of the actinic radiation pass for exiting the prism. The two portions of the actinic radiation can pass through the same or different exit surfaces of the prism.

Normally, enough optical power is available for efficiently writing long-period gratings, and the new amplitude mask provides for conveying more of this available power to the photosensitive media. The new amplitude mask can also be arranged for use with lower power sources by making more efficient use of incident radiation. Instead of diverting the normally unwanted portion of the actinic radiation away from the photosensitive media, the new amplitude mask can be arranged with an array of transmissive mechanisms (e.g., refractors) to redirect this radiation to the otherwise illuminated segments of the photosensitive medium. Both the portions of the actinic radiation thereby contribute to writing grating patterns in the photosensitive medium.

DRAWINGS

DETAILED DESCRIPTION

Figure 1:
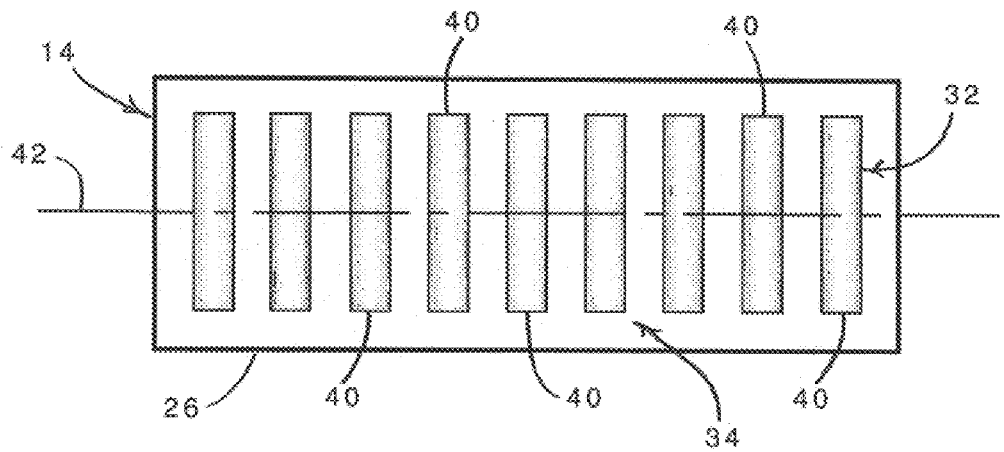
FIG. 1 is a schematic bottom view of a new amplitude mask with an array of diffusers.
Figure 2:
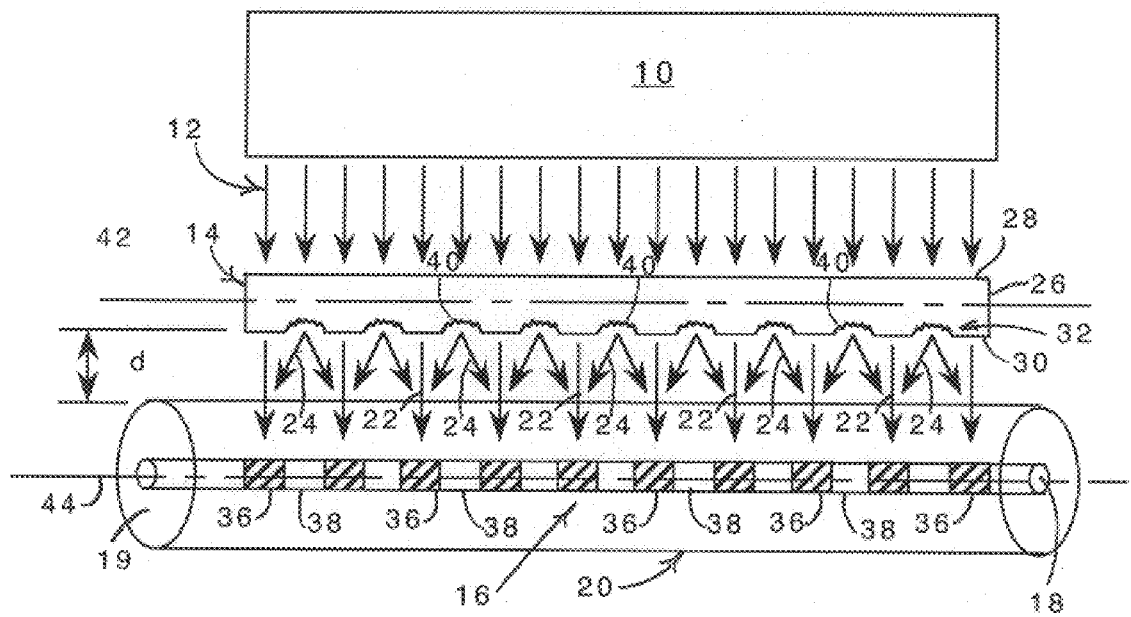
FIG. 2 is a schematic side view of a new grating writing system incorporating the amplitude mask of FIG. 1 for scattering unwanted radiation away from a long-period grating.

The invention is useful for writing long-period gratings in optical waveguides, particularly optical fibers. FIGS. 1 and 2 depict an embodiment of the invention using the mechanism of diffusion for scattering unwanted light.

A source 10 of actinic radiation, such as a 248-nanometer krypton-fluoride (KrF) excimer laser, emits a field of substantially collimated radiation 12 interrupted by a new amplitude mask 14 for writing a long-period grating 16 along a core 18 of an optical fiber 20, such as a Corning Flexcore 1060 fiber. The core 18 is made of a photosensitive material, such as a hydrogen-loaded germanosilicate, that reacts with the radiation 12 to produce a change in refractive index. Although divided into alternating first and second radiation portions 22 and 24 that undergo different optical treatments, substantially all of the radiation 12 transmits through the amplitude mask 14.

A base optic 26 of the amplitude mask 14 is preferably a glass plate made of a material, such as calcium fluoride, lithium fluoride, or fused (synthetic) quartz that is transparent to the actinic radiation 12. The first radiation portions 22 of the actinic radiation 12 transmit through parallel front and back surfaces 28 and 30 of the base optic 26 without substantial change in form or direction. However, the second radiation portions 24 encounter an array 32 of individual diffusers 40 on the back surface 30 of the base optic 26.

The individual diffusers 40 of the array 32 together with interspersed portions of the back surface 30 of the base optic 26 constitute a shadow-forming pattern 34. The first radiation portions 22, which transmit through the shadow-forming pattern 34 without change, illuminate periodically distributed segments 36 of the photosensitive medium. The second radiation portions 24, which encounter the diffusers 40 of the array 32, begin to scatter before reaching adjacent segments 38 the photosensitive medium. The scattering function of the diffuser array 32 significantly decreases concentrations of the second radiation portions 24 reaching the adjacent segments 38 largely as a square of a distance "d" between the amplitude mask 14 and the fiber 20. Large distances "d" are preferred for this purpose. However, if the amplitude mask 14 is positioned too far from the fiber 20 (i.e., "d" is too large), diffraction effects reduce contrast between the illuminated and non-illuminated segments 36 and 38 of the photosensitive medium. A distance of about 3 centimeters when the grating period is several hundred microns is a good compromise for this embodiment.

Figure 3:
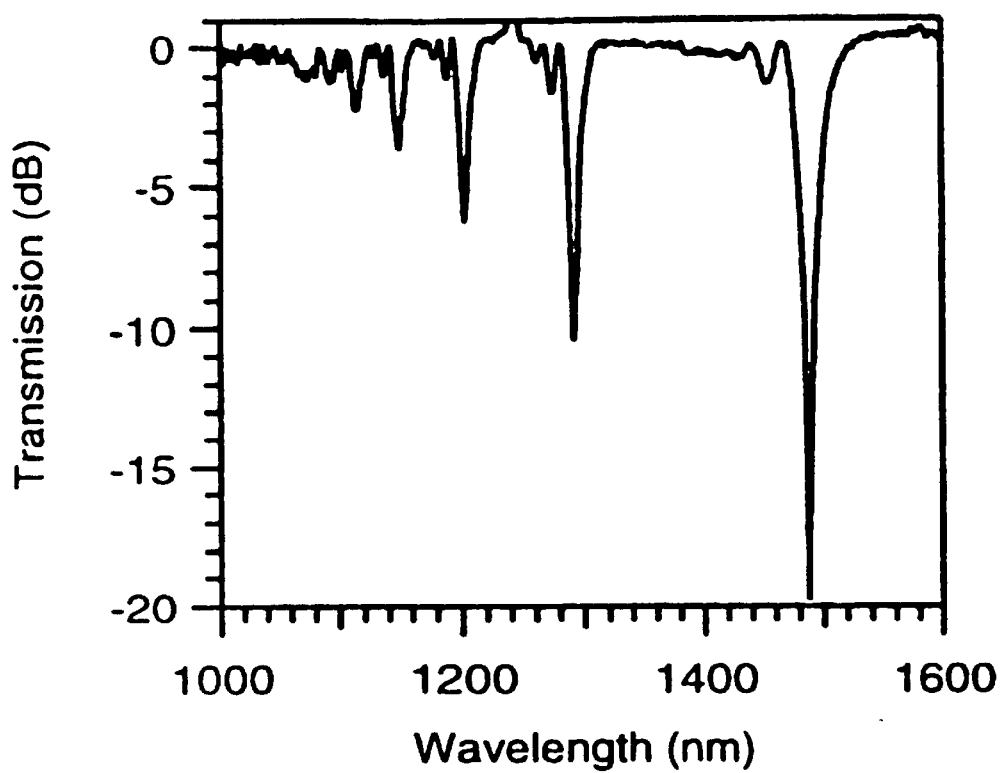
FIG. 3 is a graph of the transmission spectrum of the long-period grating formed with the system of FIG. 2.

The long-period grating 16 written into the fiber 20 has, for example, a period of approximately 340 microns throughout a length of about 3.25 centimeters. FIG. 3 plots the measured transmission spectrum of the long-period grating 16. A −20 dB (decibel) dip in the transmission spectrum just short of a wavelength of 1500 nanometers indicates that approximately 99% of the light carried by the fiber 20 is coupled from the core 18 to a surrounding cladding 19.

The diffuser array 32 can be etched into the base optic 26 by well-known chemical or mechanical means, including engraving using acid or acid fumes or scribing with a diamond stylus. Alternatively, deposition techniques, including physical or chemical vapor deposition and sol-gel treatments can be used to add additional transparent material with a non-uniform surface structure to scatter the second radiation portions 24. Instead of forming the diffuser elements 40 within discrete portions of the back surface 30 (which is assumed to be initially polished), an array of polished surfaces could be formed within discrete portions of an otherwise unpolished back surface 30 to produce a similar shadow-forming pattern 34.

The individual diffuser elements 40 of the array 32 are preferably single rough-cut troughs or deposited ridges that are oriented substantially perpendicular to both an axis 42 of the shadow-forming pattern 34 and an axis 44 of the fiber 20 or skewed with respect to either axis 44 or 44 for blazing or otherwise modifying interfaces between the segments 36 and 38. The individual diffuser elements 40 can also be shaped to produce scattering patterns that result in a more sinusoidal intensity variation between the segments 36 and 38 to avoid unwanted harmonic couplings.

Although the shadow-forming pattern 34 extends along the back surface 30 of the base optic 26, similar results can be obtained by locating the shadow-forming pattern 34 on the front surface 28 of the base optic 26. In fact, plate thickness provides additional distance for scattering the second radiation portions 24. A compound scattering function can be achieved by aligning similar diffuser arrays 32 on both the front and back surfaces 28 and 30 of the base optic 26.

Figure 4:
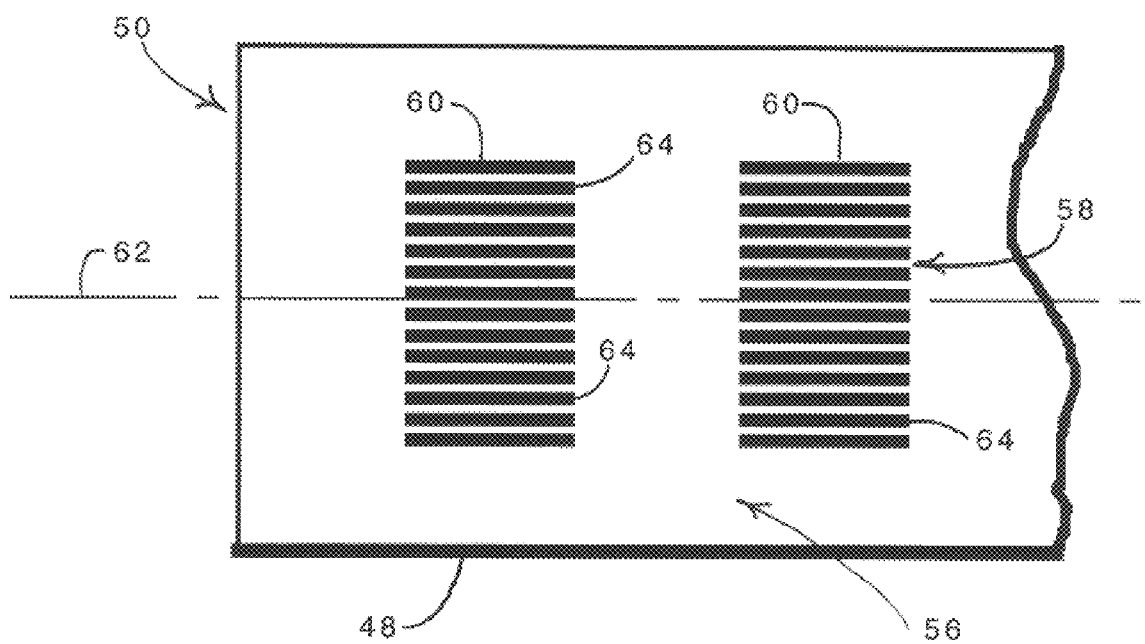
FIG. 4 is an enlarged broken-away bottom view of a new amplitude mask with an array of diffraction gratings.
Figure 5:
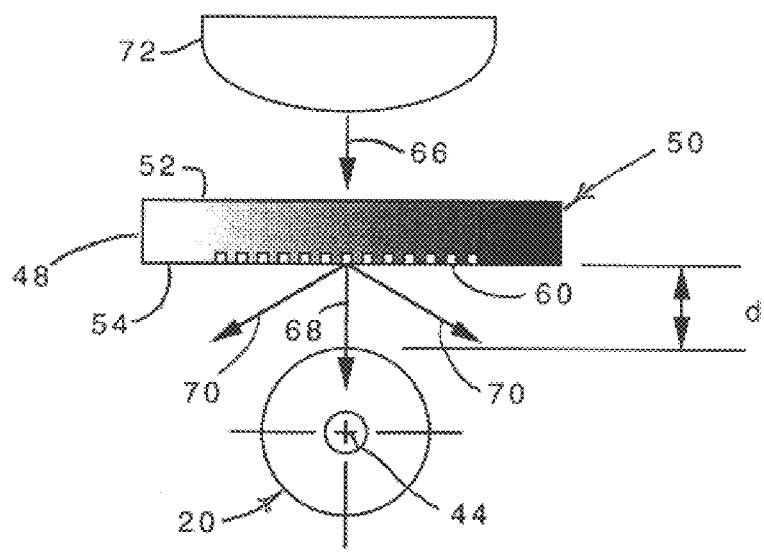
FIG. 5 is a schematic side view of a new grating writing system incorporating the amplitude mask of FIG. 4 for diffracting unwanted radiation away from the long-period grating.

The mechanism of diffraction is featured in the embodiment of FIGS. 4 and 5 for forming the required illumination pattern along the optical fiber 20. A similar base optic 48 of an amplitude mask 50 with parallel front and back surfaces 52 and 54 includes a shadow-forming pattern 56 along the back surface 54 including a diffractor array 58 of individual diffraction gratings 60. Similar to the preceding embodiment, overall dimensions of the diffraction gratings 60 extend substantially perpendicular to both an axis 62 of the diffractor array 58 and the axis 44 of the fiber 20. However, individual rulings 64 of the gratings 60 preferably extend parallel to both axes 62 and 44 for diffracting unwanted light in a direction transverse to the fiber axis 44.

The shadow-forming pattern 56 divides collimated actinic radiation 66 reaching the base optic 48 into first portions 68 that transmit through both surfaces 52 and 54 substantially without a change in direction and second portions 70 that transmit through both surfaces 52 and 54 and the diffraction array 58 with a change in direction. Since the rulings 64 are oriented parallel to the fiber axis 44, periods of the gratings 60 can be set independently of intended period of the long-period grating 16 to adjust the amount of angular diffraction into first and higher orders of diffraction. Zero diffraction orders are preferably blocked by diffracting the radiation portions 70 into the higher diffraction orders.

The first radiation portions 68 illuminate the periodically distributed segments 36 of the photosensitive medium. The second radiation portions 70 are diverted from the adjacent segments 38 of the photosensitive medium. In comparison to the diffuser elements 40 of the preceding embodiment, the diffraction gratings 60 provide more orderly control over the second radiation portions 70 that are directed away from the fiber axis 44. Instead of discarding the second radiation portions 70, the further control could be used to direct the second radiation portions 70 to illuminate the periodically distributed segments 36 of the photosensitive medium in conjunction with or as an alternative to the first radiation portions 68. For example, the actinic radiation 66 could be offset so that the first radiation portions 68 transmit through the amplitude mask 50 beyond the fiber core 18 and the second radiation portions 70 diffract into alignment with the core 18.

An alternative means for directing the second radiation portions 70 to illuminate the periodically distributed segments 36 of the photosensitive medium is to align the individual grating lines 64 substantially parallel to both the axis 62 of the diffractor array and the axis 44 of the fiber. In this way, at the appropriate distances d, the diffracted radiation is directed away from the regions in the photosensitive medium 38 directly behind the gratings, and into the regions of the photosensitive medium 36 directly behind the regions between the gratings.

Preferably, a cylindrical focusing optic 72 initially converges the actinic radiation 66 towards the fiber axis 44 to limit the distance "d" through which the amplitude mask 50 must be spaced to redirect the second radiation portions 70 away from the photosensitive material of the fiber 20. (Note: A narrow axial field of radiation is more readily diverted from axis than a wider band straddling the axis.) Blazing can be used to split the radiation portions 70 into positive and negative diffraction orders on opposite sides of the fiber axis 44 to further limit the distance "d" of the amplitude mask 50.

The diffraction gratings 60 can be formed similar to the diffuser elements 40 by removing transparent material from or adding transparent material to the base optic 48. For example, the rulings 64 can be cut with tooling (e.g., diamonds) or holographically imaged using photoresists and then chemically etched. Replication techniques are also possible. Other shapes, spacings, and angular orientations of the grating rulings 64 can be used to modify the illumination pattern in the fiber core 18. The diffractive optic array 58 can be formed along either or both surfaces 52 and 54 of the base optic 48.

Figure 6:
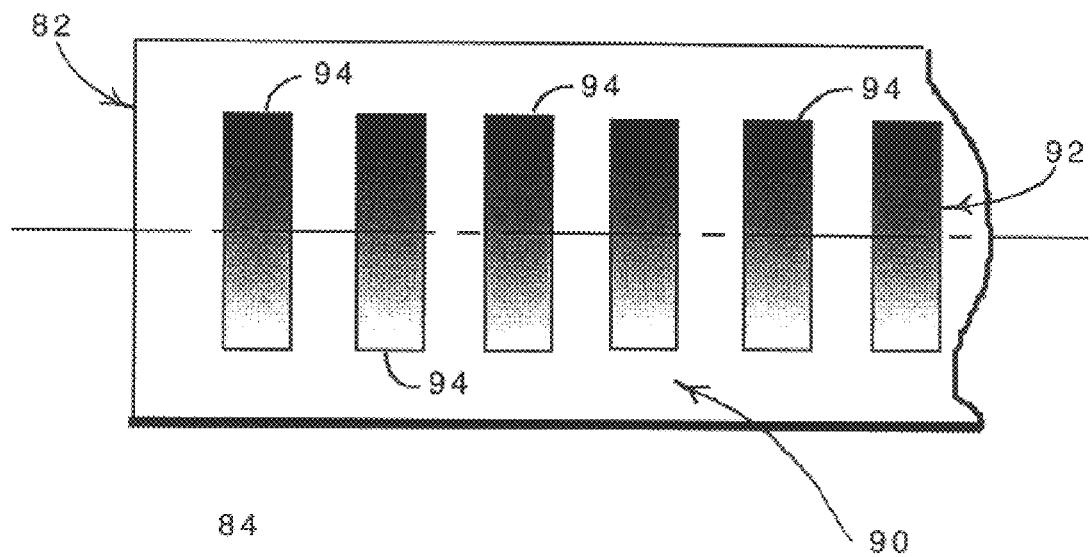
FIG. 6 is an enlarged broken-away bottom view of a new amplitude mask with an array of prisms.
Figure 7:
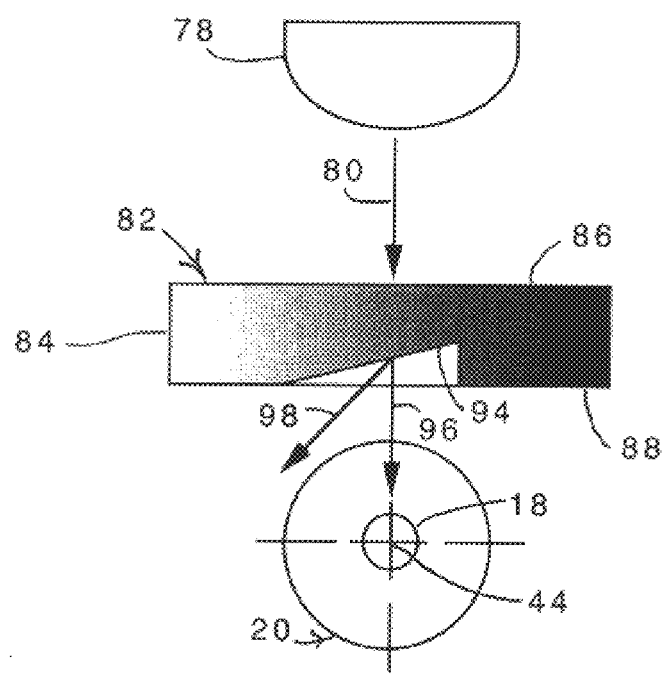
FIG. 7 is a schematic side view of a new grating writing system incorporating the amplitude mask of FIG. 6 for bending unwanted radiation away from the long-period grating.

Refraction is featured in the embodiment of FIGS. 6 and 7 as another optical mechanism for diverting unwanted radiation in a transmissive mode. A cylindrical lens 78 converges actinic radiation 80 towards the fiber axis 44 into a narrow axial field interrupted by an amplitude mask 82. A plate-shaped base optic 84 of the amplitude mask 82 includes parallel front and back surfaces 86 and 88 and a shadow-forming pattern 90 along the back surface 88.

The shadow-forming pattern 90 includes a refractor array 92 of individual prisms 94 along the back surface 88. The prisms 94 are oriented to bend light away from the fiber axis 44. First portions 96 of the actinic radiation 80 pass through the base optic 84 without change and illuminate the periodically distributed segments 36 in the fiber core 18. Second portions 98 of the actinic radiation 80 encounter the refractor array 92, and the individual prisms 94 bend the second portions 98 out of alignment with the fiber core 18. The distance "d" is adjusted so that most of the field intensity of the second radiation portions 98 misses the fiber core 18 to achieve a desired amount of contrast between the illuminated and non-illuminated segments 36 and 38 of the fiber core 18.

Figure 8:
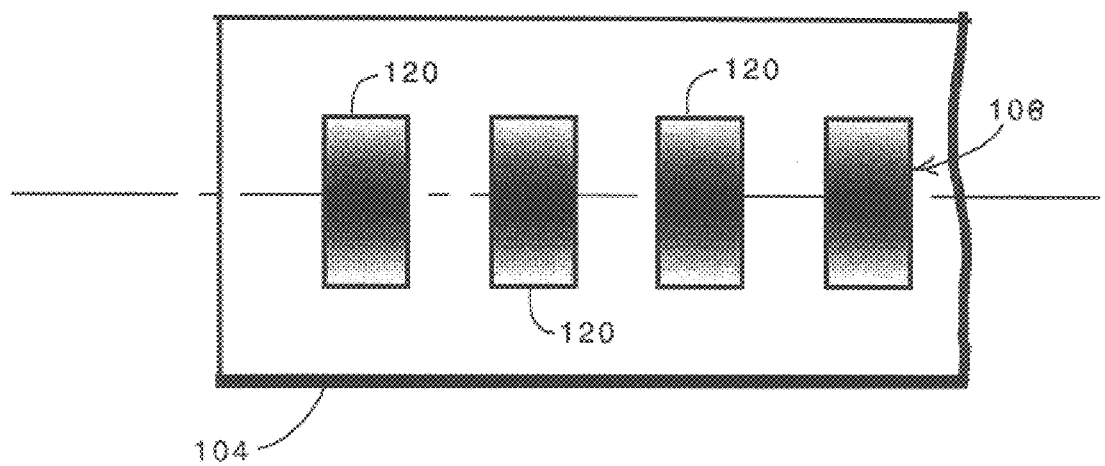
FIG. 8 is an enlarged broken-away bottom view of a new amplitude mask with two arrays of lenses.
Figure 9:
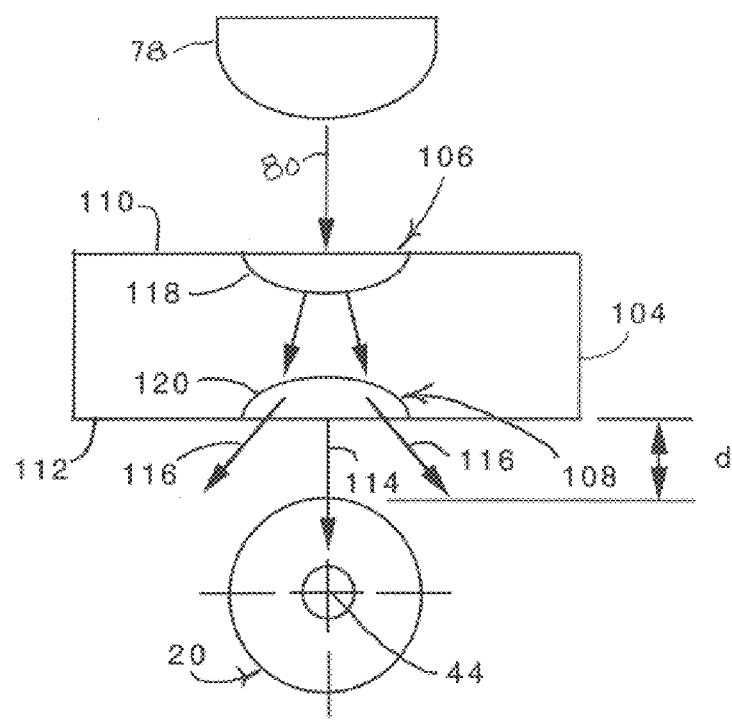
FIG. 9 is a schematic side view of a new grating writing system incorporating the amplitude mask of FIG. 8 for diverging unwanted radiation away from the long-period grating.

Other forms of refractors can be substituted for the prisms 94 along a similar base optic 104 as illustrated by FIGS. 8 and 9. First and second refractor arrays 106 and 108 are formed in front and back surfaces 110 and 112 of the base optic 104. First portions 114 of the actinic radiation 80 pass through the base optic 104 without change. Second portions 116 of the actinic radiation 80 encounter the two refractor arrays 106 and 108. The first refractor array 106 includes individual lenses 118 that diverge the second radiation portions 116 entering the base optic 104. The second refractor array 108 includes other individual lenses 120 that further diverge the second radiation portions 116 leaving the base optic 104.

Although only one of the refractor arrays 106 and 108 is expected to be needed most of the time to achieve the required contrast between illuminated and non-illuminated segments 36 and 38 of a photosensitive medium, the two refractor arrays 106 and 108 exemplify the compound effects that can be achieved by interrupting the propagation of actinic radiation 80 with more than one shadow-forming pattern. For example, combining the two refractor arrays 106 and 108 significantly increases the rate of divergence of the second radiation portions 116 away from the fiber axis 44 for achieving better contrast between the illuminated and non-illuminated segments 36 and 38 of the fiber core 18.

The refractor arrays 92, 106, and 108 can be arranged according to well-known design principles of refractive optics to control both the directions and the concentrations of the second radiation portions 116 for alternative or additional purposes. For example, the refractor arrays 92, 106, and 108 could direct the second radiation portions 116 to the periodically distributed segments 36 of the photosensitive medium in conjunction with or as an alternative to the first radiation portions 114. In addition, concentrations of the second radiation portions 116 could be adjusted to modify the interfaces between the illuminated and non-illuminated segments 36 and 38 of the fiber core 18, such as producing a more sinusoidal intensity variation along the fiber axis 44. Variations among the illuminated segments are also possible for chirping or otherwise modifying performance of the manufactured gratings 16.

Figure 10:
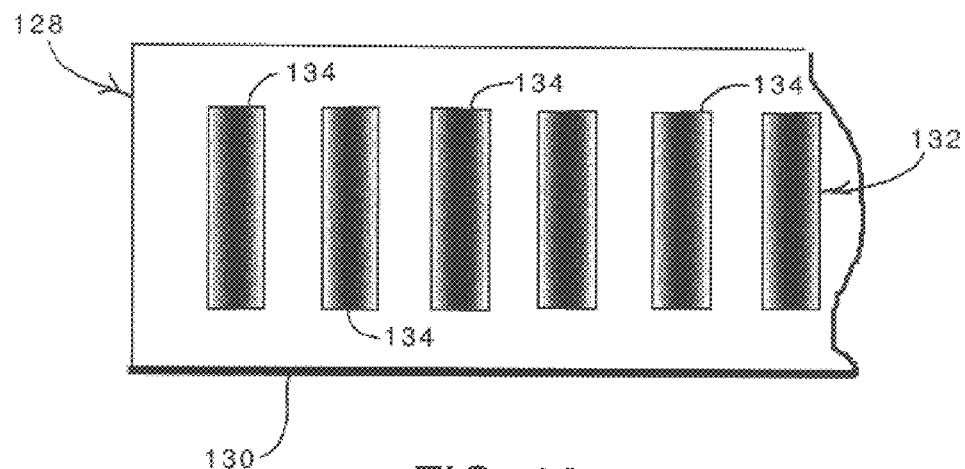
FIG. 10 is an enlarged broken-away bottom view of a new amplitude mask with an alternative array of prisms.
Figure 11:
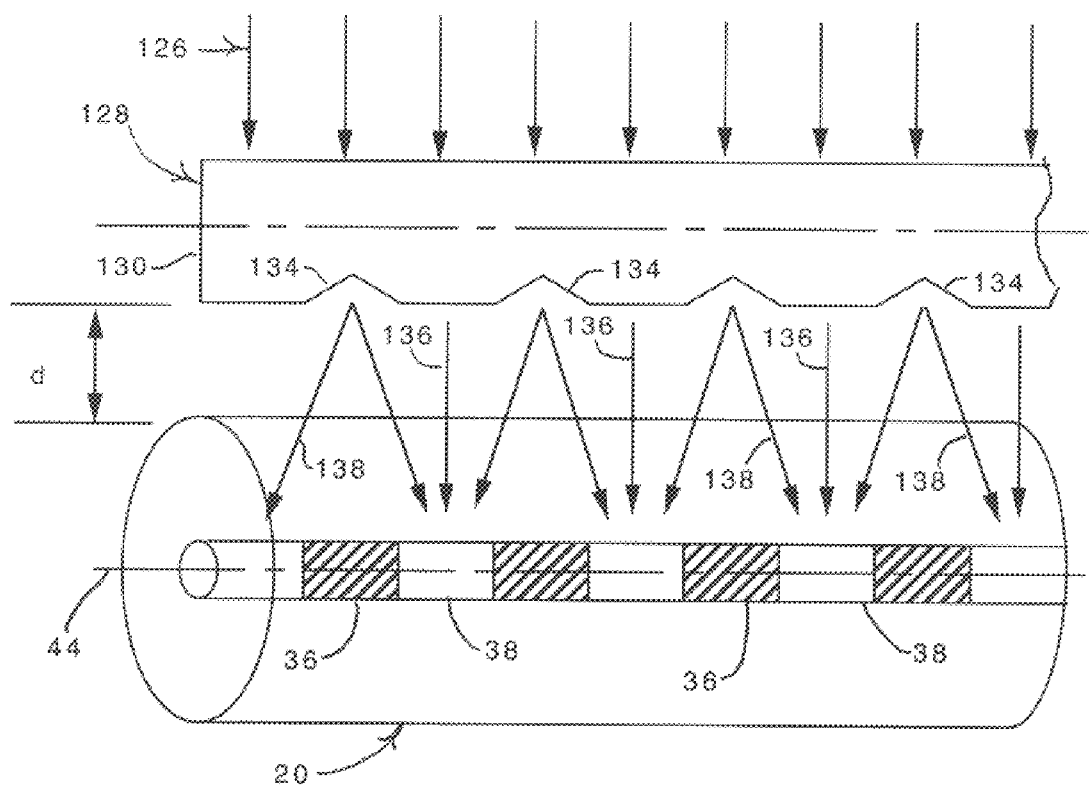
FIG. 11 is a schematic side view of a new grating writing system incorporating the amplitude mask of FIG. 8 for redirecting light along the grating axis.

A more efficient use of actinic radiation 126 incident upon an amplitude mask 128 is apparent from the embodiment of FIGS. 10 and 11. The amplitude mask 128 has a plate-shaped base optic 130 similar to those previously described along with a refractor array 132 for forming a shadow pattern on the fiber core 18. Individual prisms 134 are shaped to divert light along the fiber axis 44. First portions 136 of the actinic radiation 126 pass through the amplitude mask 128 substantially without change and illuminate the periodically distributed segments 36 of the fiber core 18. Second portions 138 of the actinic radiation 126 refract from their original paths and illuminate the same periodically distributed segments 36 of the fiber core 18. The distance "d" is determined so that the first and second radiation portions 136 and 138 intercept each other along the fiber axis 44.

Instead of discarding the second radiation portions 138, the amplitude mask 128 combines the first and second radiation portions 136 and 138 for writing the long-period grating 16. Since less of the actinic radiation 126 is wasted, lower power sources, such as UV lamps, can be used without increasing exposure times. A similar result can be obtained by refracting both the first and the second radiation portions 136 and 138 to the same positions along the fiber axis 44.

The refractor arrays 92, 106, 108, and 132 can be made similar to the earlier described diffuser and diffractor arrays 32 and 58. This includes etching or otherwise removing material from the base optics 84, 104, and 130 or by appending additional material or structure to the same base optics 84, 104, and 130.

Figure 12:
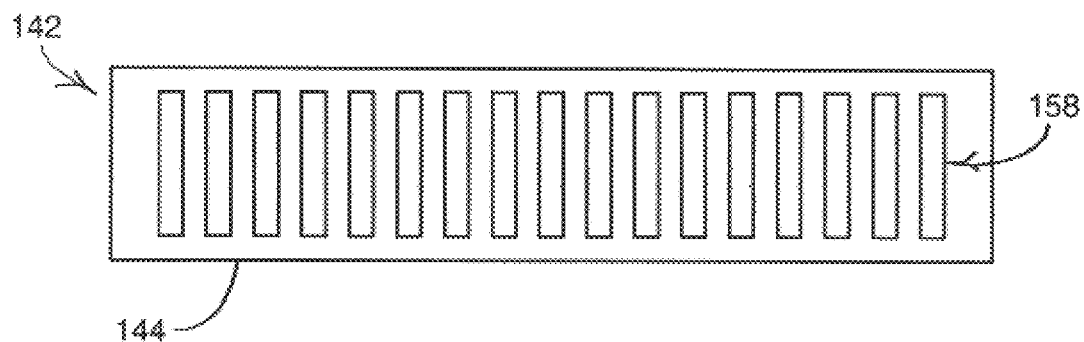
FIG. 12 is a schematic bottom view of a new amplitude mask with an alternative array of prisms formed on a surface of a prism.
Figure 13:
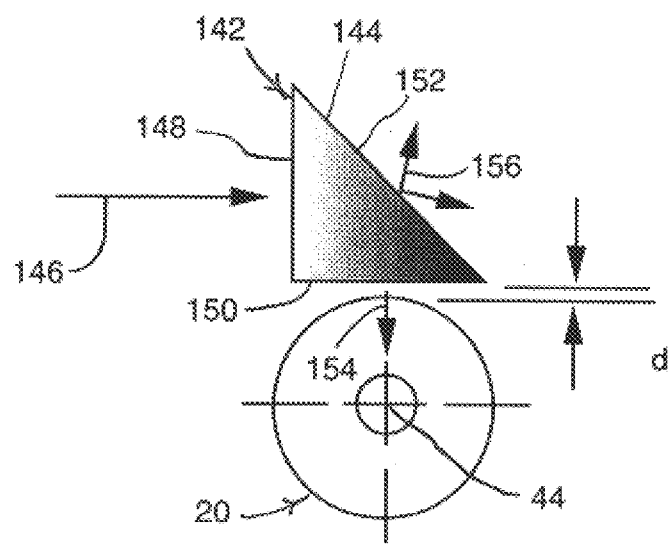
FIG. 13 is a schematic side view of a new grating writing system incorporating the amplitude mask of FIG. 8 for directing unwanted radiation away from the long period grating.

All of the embodiments have so far included plate-shaped base optics with parallel front and back surfaces oriented normal to incident radiation. However, other transparent base optics, such as prisms, can also be used to transmit actinic radiation in a desired pattern to a photosensitive medium. For example, FIGS. 12 and 13 depict a base optic 144 of an amplitude mask 142 in the form of a right-angle prism having entry and exit leg surfaces 148 and 150 joined by a hypotenuse surface 152. Actinic radiation 146 bound for the optical fiber 20 enters the prism through the leg surface 148. First portions 154 of the radiation 146 exit through the leg surface 150 after internally reflecting from the hypotenuse surface 152. Second portions 156 of the radiation 146 encounter a diffuser array 158 that provides an alternative exit for the second portions 156 through the hypotenuse surface 152.

The periodically distributed segments 36 of the fiber core are illuminated by the first radiation portions 154 that transmit through of the two leg surfaces 148 and 150. The unwanted second radiation portions 156 are directed entirely away from the optical fiber 20 through the hypotenuse surface 152. The distance "d" between the base prism optic 144 and the optical fiber 20 can be reduced to near zero because divergence of the second radiation portions 156 is not required to avoid illuminating the adjacent segments 38 of the photosensitive medium.

Other prism shapes can also be used to achieve similar objectives including dove prisms, which can be used to maintain alignment of first radiation portions 154 with the incident radiation 146. The base optic could also take the form of a lens, such as a cylindrical lens, that is modified with a shadow-forming pattern to scatter or direct radiation portions away from the adjacent segments 38 of the fiber core 18. In addition, instead of forming the base optic of this or any of the earlier embodiments from a single transmissive body, the base optic could be assembled from a plurality of transmissive components. The shadow-forming pattern could also be formed in a separate transmissive body attached to the base optic. For example, the base prism could be mated with alternative shadow-forming patterns at an internally reflective surface so that the same base prism could be used to manufacture a range of different gratings.

All of the embodiments write the long-period grating 16 along the solely depicted optical fiber 20. However, the above-described amplitude masks can also be used to write long-period gratings in other waveguide structures including planar waveguides. The gratings themselves which are referred to as having long periods include those whose periodic structures can be reproduced by corresponding diffraction-limited periodic structures of the amplitude masks. The shadowing function of the amplitude masks is also distinguished by this feature from interference patterns produced by intersecting diffraction orders of phase masks.

Lasers (e.g., excimer lasers) are the preferred source for the actinic radiation, although lamps, such as UV lamps, can be used as well. Since the periodic illumination patterns are cast by shadowing rather than interference, coherency requirements for the radiation sources are relaxed. The generation of heat by the amplitude masks is significantly. reduced in comparison to masks that block unwanted portions of the radiation because both the originally wanted and unwanted portions of the actinic radiation are transmitted through the new amplitude masks. Accordingly, the new amplitude masks can safely transfer more energy from the radiation sources to the waveguides without risk of damage. In many instances, the energy that can be conveyed by the new amplitude masks is expected to exceed the energy that can be safely received by the waveguides, allowing manufacturing rates to be fully optimized.)

We claim:

1. An amplitude mask for writing long-period gratings in optical waveguides comprising:

a base optic made of a material capable of transmitting actinic radiation for writing the long-period gratings in a photosensitive medium of the optical waveguides;

a shadow-forming pattern along the base optic that provides for illuminating periodically distributed segments of the photosensitive medium with the actinic radiation transmitted through the base optic;

first transmissive portions of the shadow-forming pattern that convey first portions of the actinic radiation to the periodically distributed segments of the photosensitive medium;

second transmissive portions of the shadow-forming pattern that relatively divert second portions of the actinic radiation away from adjacent segments of the photosensitive medium;

each of the first transmissive portions being arranged for illuminating a corresponding segment of the photosensitive medium;

the first and second transmissive portions alternating in position along the base optic; and one of the first and second transmissive portions including an array of diffractors for, relatively diffracting the first and second portions of the actinic radiation.

2. The mask of claim 1 in which the diffractors include rulings oriented substantially parallel to optical axes of the waveguides for relatively diffracting the second portions of the actinic radiation substantially transverse to the waveguide axes.

3. The mask of claim 1 in which the diffractors include rulings oriented substantially perpendicular to optical axes of the waveguides for relatively diffracting the second portions of the actinic radiation substantially along of the waveguide axes so that both portions of the actinic radiation are conveyed to the periodically distributed segments of the photosensitive medium.

4. The mask of claim 1 in which the diffractors are arranged to diffract most of the second portions of the actinic radiation through non-zero diffraction orders.

5. An amplitude mask for writing long-period gratings in optical waveguides comprising:

a base optic made of a material capable of transmitting actinic radiation for writing the long-period gratings in a photosensitive medium of the optical waveguides;

a shadow-forming pattern along the base optic that provides for illuminating periodically distributed segments of the photosensitive medium with the actinic radiation transmitted through the base optic;

first transmissive portions of the shadow-forming pattern that convey first portions of the actinic radiation to the periodically distributed segments of the photosensitive medium;

second transmissive portions of the shadow-forming pattern that relatively divert second portions of the actinic radiation away from adjacent segments of the photosensitive medium;

each of the first transmissive portions being arranged for illuminating a corresponding segment of the photosensitive medium;

the first and second transmissive portions alternating in position along the base optic; and one of the first and second transmissive portions including an array of refractors for relatively bending the first and second portions of the actinic radiation in different distinct directions.

6. The mask of claim 5 in which the array of refractors are arranged parallel to optical axes of the waveguides and the refractors are oriented for relatively bending the second portions of the actinic radiation substantially transverse to the waveguide axes.

7. The mask of claim 5 in which the array of refractors are arranged parallel to optical axes of the waveguides and the refractors are oriented for relatively bending the second portions of the actinic radiation substantially along of the waveguide axes so that both portions of the actinic radiation are conveyed to the periodically distributed segments of the photosensitive medium.

8. The mask of claim 5 in which the refractors include prisms.

9. The mask of claim 5 in which the refractors include lenses.

10. The mask of claim 5 in which the refractive optics modify the base optic by selective removal optical material.

11. The mask of claim 5 in which the refractive optics modify the base optic by the selective addition of optical material.

12. An amplitude mask for writing long-period gratings in optical waveguides comprising:

a base optic made of a material capable of transmitting actinic radiation for writing the long-period gratings in a photosensitive medium of the optical waveguides;

a shadow-forming pattern along the base optic that provides for illuminating periodically distributed segments of the photosensitive medium with the actinic radiation transmitted through the base optic;

first transmissive portions of the shadow-forming pattern that convey first portions of the actinic radiation to the periodically distributed segments of the photosensitive medium;

second transmissive portions of the shadow-forming pattern that relatively divert second portions of the actinic radiation away from adjacent segments of the photosensitive medium;

each of the first transmissive portions being arranged for illuminating a corresponding segment of the photosensitive medium;

the first and second transmissive portions alternating in position along the base optic; and the base optic being a prism having an entry surface through which the first and second portions of the actinic radiation pass for entering the prism and one or more exit surfaces through which the first and second portions of the actinic radiation pass for exiting the prism.

13. The mask of claim 12 in which the first and second portions of the actinic radiation pass through different exit surfaces of the prism.

14. The mask of claim 12 in which the prism includes at least one intermediate surface for internally reflecting the actinic radiation between the entry and exit surfaces.

15. The mask of claim 14 in which the shadow-forming pattern is located long the intermediate surface of the prism.

16. An amplitude mask for writing long-period gratings in optical waveguides comprising:

a base optic made of a material capable of transmitting actinic radiation for writing the long-period gratings in a photosensitive medium of the optical waveguides;

a shadow-forming pattern along the base optic that provides for illuminating periodically distributed segments of the photosensitive medium with the actinic radiation transmitted through the base optic;

first transmissive portions of the shadow-forming pattern that convey first portions of the actinic radiation to the periodically distributed segments of the photosensitive medium;

second transmissive portions of the shadow-forming pattern that relatively divert second portions of the actinic radiation away from adjacent segments of the photosensitive medium;

each of the first transmissive portions being arranged for illuminating a corresponding segment of the photosensitive medium;

the first and second transmissive portions alternating in position along the base optic; and the first and the second transmissive portions of the shadow-forming pattern being arranged to direct both portions of the actinic radiation to the periodically distributed segments of the photosensitive medium.

17. A method of writing long-period gratings comprising the steps of:

positioning an amplitude mask between a source of actinic radiation and an optical waveguide containing a photosensitive medium;

interrupting propagation of the actinic radiation from the source of the actinic radiation to the optical waveguide with a shadow-forming pattern of the amplitude mask that restricts illumination of the photosensitive medium to periodically distributed segments;

transmitting first portions of the actinic radiation through first portions of the shadow-forming pattern for illuminating the periodically distributed segments of the photosensitive medium;

transmitting second portions of the actinic radiation through second portions of the shadow-forming pattern to avoid illuminating other segments of the photosensitive medium lying between the periodically distributed segments of the photosensitive medium;

the steps of transmitting including the further step of relatively diverting the second portions of the actinic radiation with respect to the first portions of the actinic radiation;

the step of relatively diverting including relatively diverting the second portions of the actinic radiation away from the photosensitive medium;

arranging the first and second portions of the shadow-forming pattern in an alternating pattern corresponding to the periodically distributed segments of the photosensitive medium; and the step of relatively diverting including diffracting the second portions of the actinic radiation away from the photosensitive medium.

18. The method of claim 17 in which the second portions are diffracted transverse to an optical axis of the waveguide.

19. A method of writing long-period gratings comprising the steps of:

positioning an amplitude mask between a source of actinic radiation and an optical waveguide containing a photosensitive medium;

interrupting propagation of the actinic radiation from the source of the actinic radiation to the optical waveguide with a shadow-forming pattern of the amplitude mask that restricts illumination of the photosensitive medium to periodically distributed segments;

transmitting first portions of the actinic radiation through first portions of the shadow-forming pattern for illuminating the periodically distributed segments of the photosensitive medium;

transmitting second portions of the actinic radiation through second portions of the shadow-forming pattern to avoid illuminating other segments of the photosensitive medium lying between the periodically distributed segments of the photosensitive medium;

the steps of transmitting including the further step of relatively diverting the second portions of the actinic radiation with respect to the first portions of the actinic radiation;

the step of relatively diverting including relatively diverting the second portions of the actinic radiation away from the photosensitive medium;

arranging the first and second portions of the shadow-forming pattern in an alternating pattern corresponding to the periodically distributed segments of the photosensitive medium; and the step of relatively diverting including refracting the second portions of the actinic radiation in a distinct direction away from the photosensitive medium.

20. The method of claim 19 in which the second portions are refracted transverse to an optical axis of the waveguide.

21. A method of writing long-period gratings comprising the steps of:

positioning an amplitude mask between a source of actinic radiation and an optical waveguide containing a photosensitive medium;

interrupting propagation of the actinic radiation from the source of the actinic radiation to the optical waveguide with a shadow-forming pattern of the amplitude mask that restricts illumination of the photosensitive medium to periodically distributed segments;

transmitting first portions of the actinic radiation through first portions of the shadow-forming pattern for illuminating the periodically distributed segments of the photosensitive medium;

transmitting second portions of the actinic radiation through second portions of the shadow-forming pattern to avoid illuminating other segments of the photosensitive medium lying between the periodically distributed segments of the photosensitive medium;

the steps of transmitting including the further step of relatively diverting the second portions of the actinic radiation with respect to the first portions of the actinic radiation;

the step of relatively diverting including relatively diverting the second portions of the actinic radiation away from the photosensitive medium;

arranging the first and second portions of the shadow-forming pattern in an alternating pattern corresponding to the periodically distributed segments of the photosensitive medium; and spacing the amplitude mask at a distance from the waveguide so that both portions of the actinic radiation overlap at the periodically distributed segments of the photosensitive medium.

22. An amplitude mask for writing long-period gratings in a photosensitive medium comprising:

a base optic having a shadow-forming pattern for dividing incident actinic radiation into first portions that illuminate periodically distributed segments of the photosensitive medium and second portions that do not substantially illuminate other segments of the photosensitive medium lying between the periodically distributed segments of the photosensitive medium;

the shadow-forming pattern including alternating sections performing different optical functions for relatively diverting the first and second portions of the actinic radiation;

both of the optical functions being substantially transmissive for minimizing absorption of heat energy from the first and the second portions of the actinic radiation; and one of the optical functions providing for relatively diffracting the first and second portions of the actinic radiation.

23. The amplitude mask of claim 22 in which the shadow-forming pattern includes an array of diffractors.

24. An amplitude mask for writing long-period gratings in a photosensitive medium comprising:

a base optic having a shadow-forming pattern for dividing incident actinic radiation into first portions that illuminate periodically distributed segments of the photosensitive medium and second portions that do not substantially illuminate other segments of the photosensitive medium lying between the periodically distributed segments of the photosensitive medium;

the shadow-forming pattern including alternating sections performing different optical functions for relatively diverting the first and second portions of the actinic radiation;

both of the optical functions being substantially transmissive for minimizing absorption of heat energy from the first and the second portions of the actinic radiation; and one of the optical functions providing for relatively refracting the first and second portions of the actinic radiation in different distinct directions.

25. The amplitude mask of claim 24 in which the shadow-forming pattern includes an array of refractors.

26. An amplitude mask for writing long-period gratings in a photosensitive medium comprising:

a base optic having a shadow-forming pattern for dividing incident actinic radiation into first portions that illuminate periodically distributed segments of the photosensitive medium and second portions that do not substantially illuminate other segments of the photosensitive medium lying between the periodically distributed segments of the photosensitive medium;

the shadow-forming pattern including alternating sections performing different optical functions for relatively diverting the first and second portions of the actinic radiation;

both of the optical functions being substantially transmissive for minimizing absorption of heat energy from the first and the second portions of the actinic radiation; and the base optic being a prism having at least one internally reflective surface for conveying the first portions of the actinic radiation to the photosensitive medium.

27. The amplitude mask of claim 26 in which the shadow-forming pattern is located along the internally reflective surface for transmitting the second portions of the actinic radiation away from the photosensitive medium.

* * * * *